US009515137B2

(12) United States Patent
Willmeroth et al.

(10) Patent No.: US 9,515,137 B2
(45) Date of Patent: Dec. 6, 2016

(54) SUPER JUNCTION SEMICONDUCTOR DEVICE WITH A NOMINAL BREAKDOWN VOLTAGE IN A CELL AREA

(71) Applicant: Infineon Technologies Austria AG, Villach (AT)

(72) Inventors: Armin Willmeroth, Augsburg (DE); Gerald Deboy, Klagenfurt (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/773,202

(22) Filed: Feb. 21, 2013

(65) Prior Publication Data

US 2014/0231912 A1 Aug. 21, 2014

(51) Int. Cl.
*H01L 29/06* (2006.01)
*H01L 29/78* (2006.01)
*H01L 29/739* (2006.01)
*H01L 29/08* (2006.01)
*H01L 29/10* (2006.01)

(52) U.S. Cl.
CPC ....... *H01L 29/0634* (2013.01); *H01L 29/0623* (2013.01); *H01L 29/0696* (2013.01); *H01L 29/0878* (2013.01); *H01L 29/1095* (2013.01); *H01L 29/7395* (2013.01); *H01L 29/7802* (2013.01); *H01L 29/7811* (2013.01); *H01L 29/0638* (2013.01)

(58) Field of Classification Search
None
See application file for complete search history.

(56) References Cited

U.S. PATENT DOCUMENTS

| 4,754,310 | A | 6/1988 | Coe |
| 5,126,275 | A | 6/1992 | Hatch et al. |
| 6,630,698 | B1 | 10/2003 | Deboy et al. |
| 6,838,729 | B2 | 1/2005 | Schlögl et al. |
| 7,335,949 | B2* | 2/2008 | Ninomiya et al. ............ 257/341 |
| 7,737,469 | B2* | 6/2010 | Saito et al. .................... 257/197 |
| 7,868,384 | B2 | 1/2011 | Lee et al. |
| 7,919,824 | B2* | 4/2011 | Ono et al. ...................... 257/401 |
| 2005/0045922 | A1* | 3/2005 | Ahlers et al. ................. 257/242 |
| 2007/0138543 | A1 | 6/2007 | Saito |
| 2007/0272979 | A1 | 11/2007 | Saito et al. |
| 2008/0237701 | A1* | 10/2008 | Willmeroth et al. ......... 257/328 |
| 2010/0078775 | A1* | 4/2010 | Mauder et al. ............... 257/655 |
| 2010/0308399 | A1* | 12/2010 | Saito et al. .................... 257/329 |
| 2012/0326226 | A1* | 12/2012 | Xiao ................ H01L 29/66712 257/329 |

FOREIGN PATENT DOCUMENTS

| CN | 101924132 A | 12/2010 |
| CN | 102468337 A | 5/2012 |
| DE | 19843959 B4 | 2/2004 |
| DE | 102006020870 B4 | 12/2010 |

* cited by examiner

*Primary Examiner* — Michael Jung
(74) *Attorney, Agent, or Firm* — Murphy, Bilak & Homiller, PLLC

(57) ABSTRACT

A super junction semiconductor device includes a super junction structure that is formed in a semiconductor body having a first and a second, parallel surface. The super junction structure includes first areas of the first conductivity type and second areas of a second conductivity type which is the opposite of the first conductivity type. In a cell area surrounded by an edge area, the super junction structure has a first nominal breakdown voltage in a first portion and a second nominal breakdown voltage, which differs from the first nominal breakdown voltage, in a second portion to provide improved avalanche ruggedness.

17 Claims, 16 Drawing Sheets

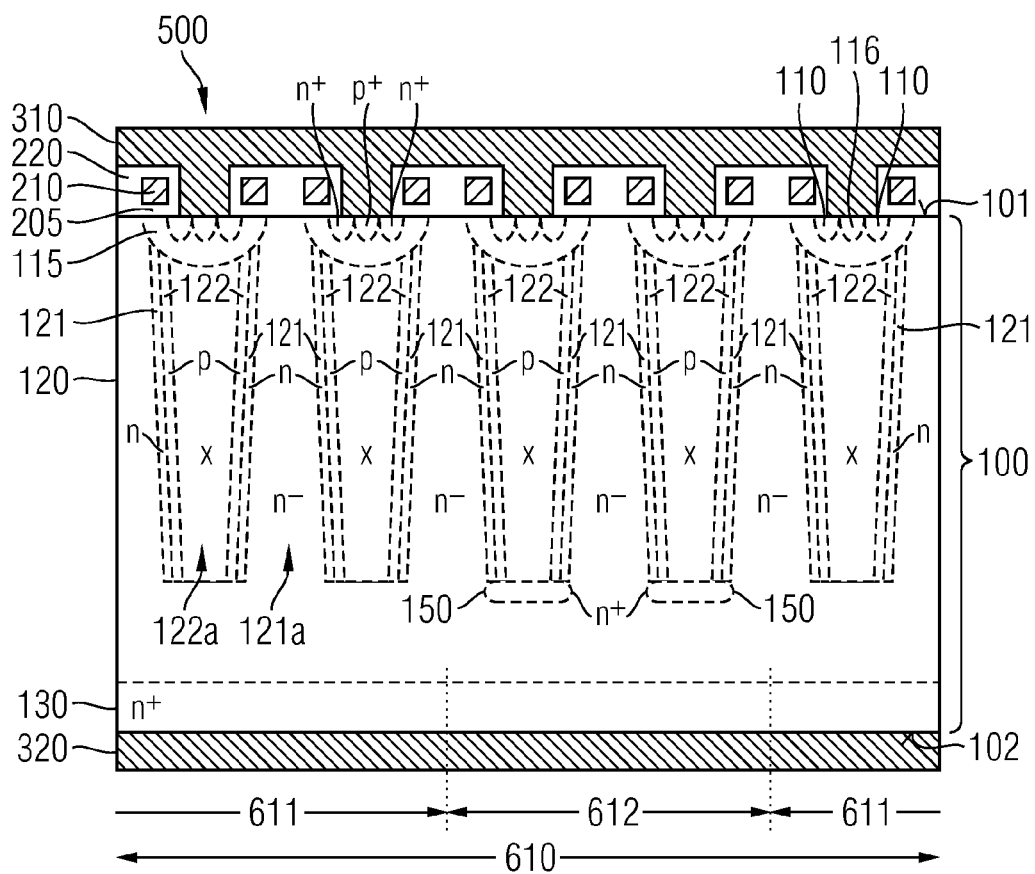

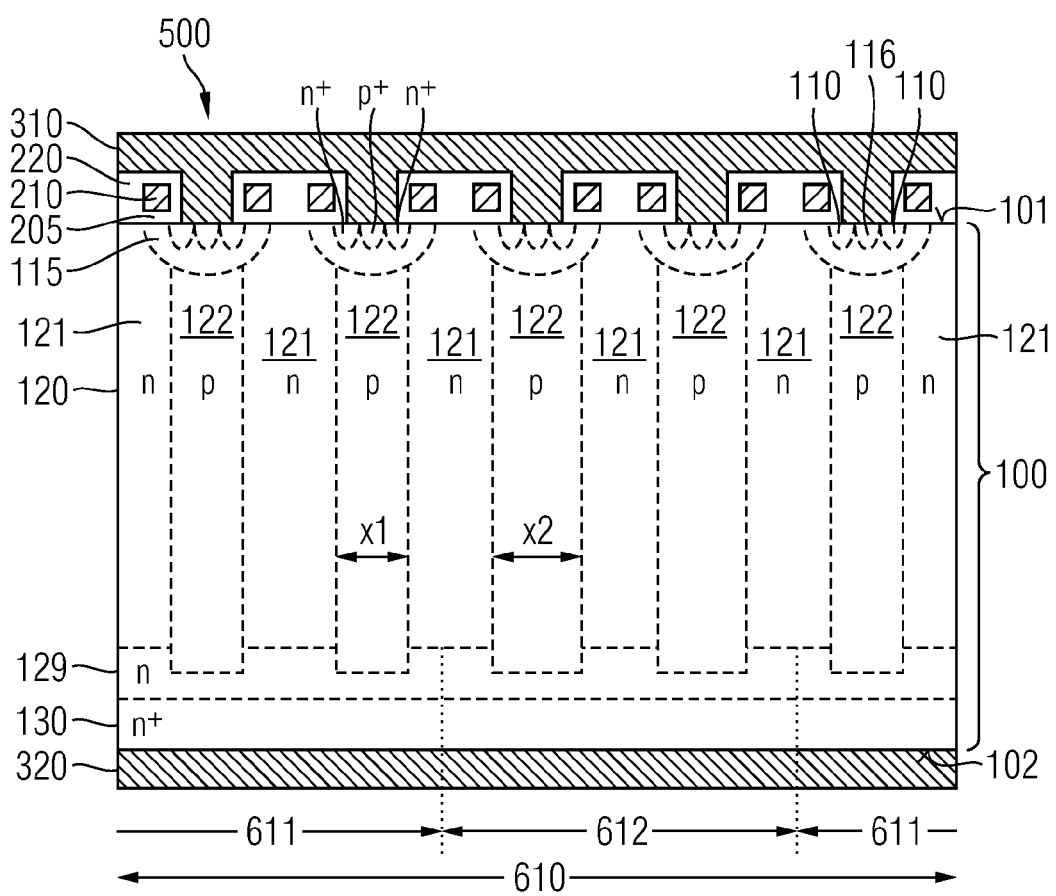

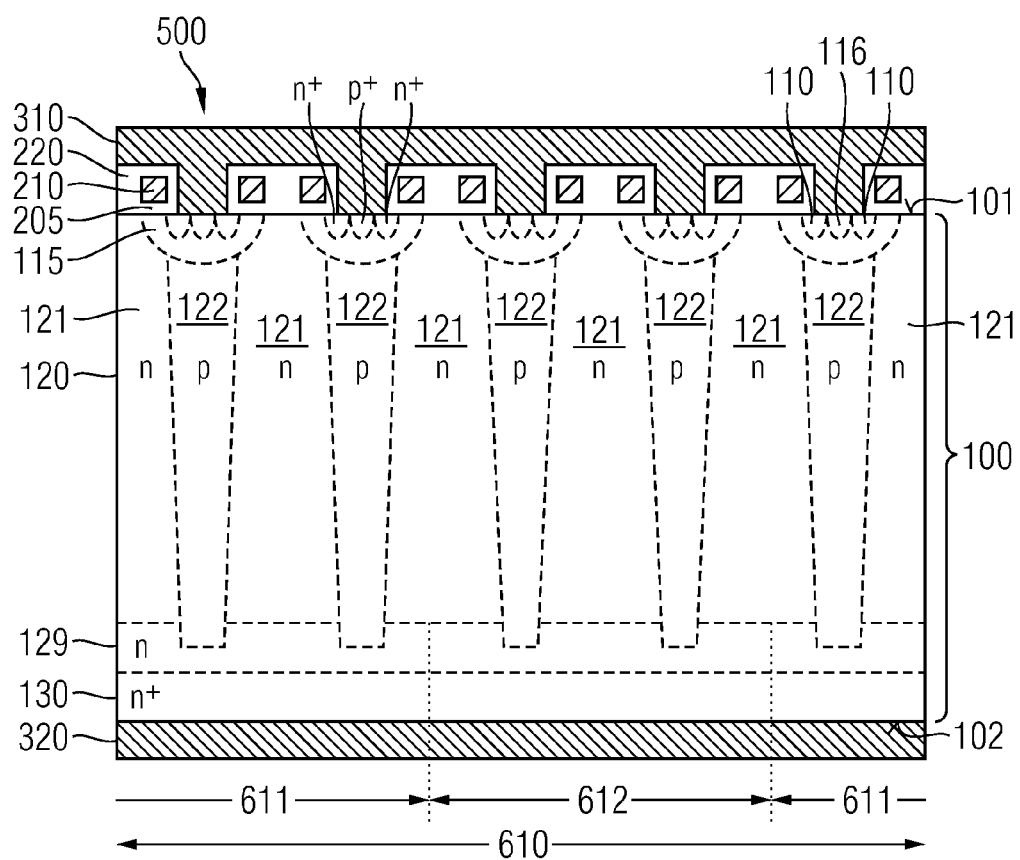

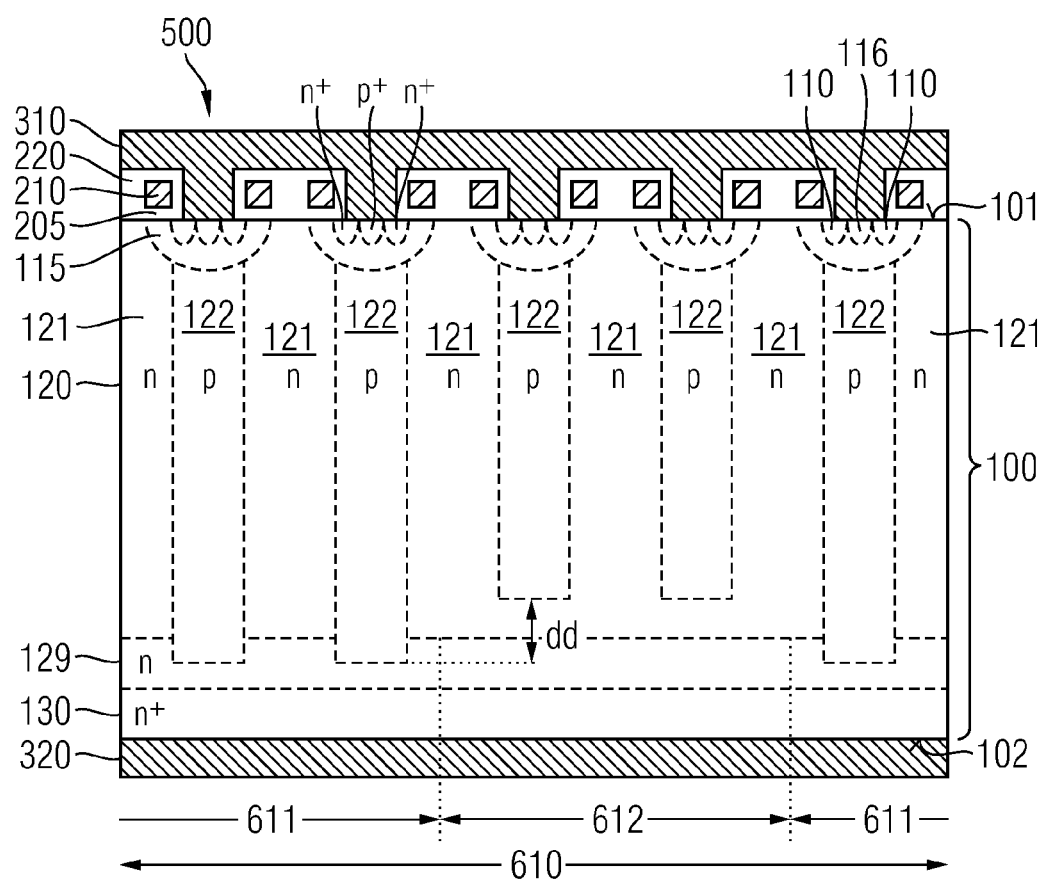

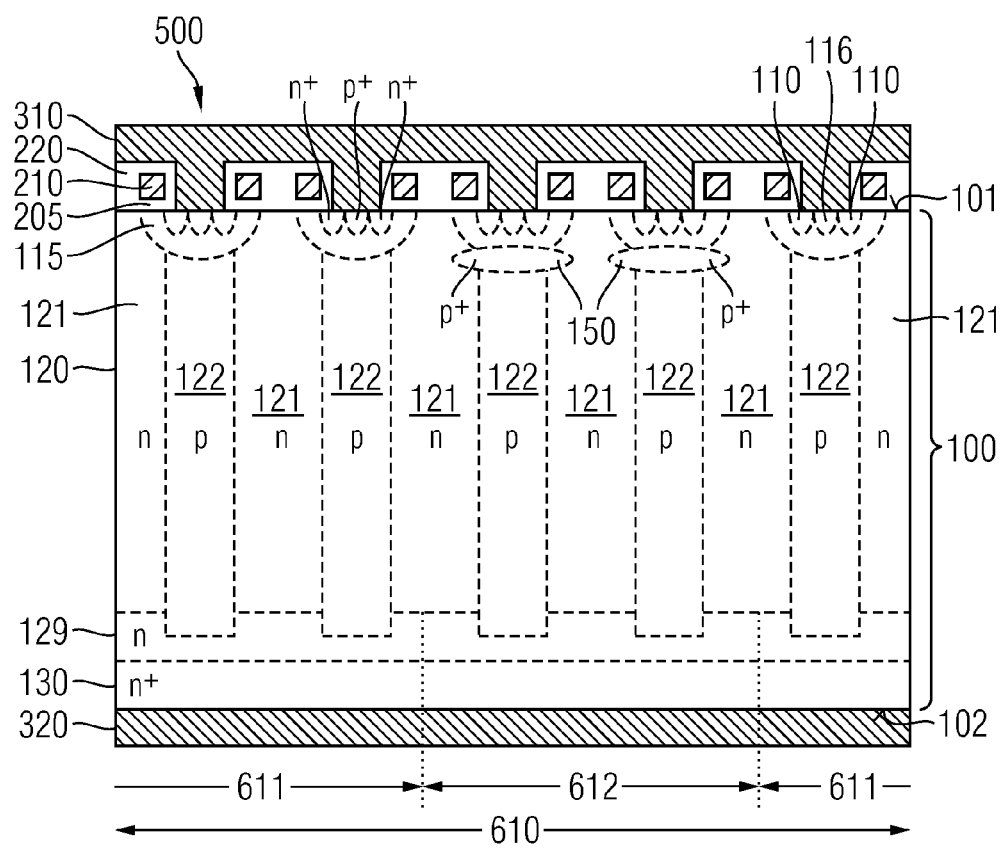

SUPER JUNCTION SEMICONDUCTOR DEVICE WITH A NOMINAL BREAKDOWN VOLTAGE IN A CELL AREA

BACKGROUND

A semiconductor body of a super junction FET (field effect transistor) includes a drift region with p-doped areas separated by n-doped areas, wherein the n-doped areas carry the on-state current for n-FETs and the p-doped areas carry the on-state current for p-FETs. In the reverse mode depletion zones extend between the p-doped and n-doped areas in a lateral direction such that super junction FETs accommodate a high reverse breakdown voltage at high impurity concentrations that provide a low on-state resistance.

In an unclamped inductive switching environment FETs directly switch off a current through an inductive load. The inductive load provokes an off-state current flowing through the FET until the energy stored in the inductive load has been dissipated. The induced current triggers an avalanche mechanism in the FET, wherein the electric field in the FET generates mobile charge carriers conveying the off-state current. Typically FET specifications specify a single-shot or repetitive avalanche ruggedness rating to allow for the design of electric circuits with safe operating conditions. It is desirable to provide super junction semiconductor devices with improved avalanche ruggedness.

SUMMARY

A super junction semiconductor device according to an embodiment includes a super junction structure that is formed in a semiconductor body having a first surface and a second surface parallel to the first surface. The super junction structure includes first areas of the first conductivity type and second areas of a second conductivity type which is the opposite of the first conductivity type. A first electrode structure directly adjoins the first surface and a second electrode structure directly adjoins the second surface. The super junction semiconductor device is configured to accommodate a voltage applied between the first and second electrode structures predominantly in a vertical direction perpendicular to the first surface in a cell area and predominantly in a lateral direction parallel to the first surface in an edge area surrounding the cell area. The super junction structure has a first nominal breakdown voltage in a first portion and a second nominal breakdown voltage lower than the first nominal breakdown voltage in a second portion.

According to another embodiment a super junction semiconductor device includes a super junction structure formed in a semiconductor body with a first surface and a second surface parallel to the first surface, wherein the super junction structure includes first areas of a first conductivity type and second areas of a second, opposite conductivity type. A first electrode structure directly adjoins the first surface and a second electrode structure directly adjoins the second surface. The super junction semiconductor device is configured to accommodate a voltage applied between the first and second electrode structures predominantly in a vertical direction perpendicular to the first surface in a cell area and predominantly in a lateral direction parallel to the first surface in an edge area surrounding the cell area. Along a vertical section of the super junction structure compensation between the first and second areas is nominally stronger de-tuned in one of the first and second portions than in the other.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated, as they become better understood by reference to the following detailed description.

FIG. 3E is a schematic cross-sectional view of a portion of a super junction semiconductor device in accordance with an embodiment providing modulation of the compensation ratio by n-type impurity zones at an n-loaded side of a super junction structure.

FIG. 4C is a schematic cross-sectional view of a portion of a super junction semiconductor device in accordance with another embodiment providing a variation of the width of p-type areas.

FIG. 5B is a schematic cross-sectional view of a portion of a super junction semiconductor device in accordance with another embodiment providing a variation of the slope angle of p-type areas.

FIG. 6A is a schematic cross-sectional view of a portion of a super junction semiconductor device in accordance with an embodiment providing a variation of the vertical extension of p-type areas.

FIG. 6B is a schematic cross-sectional view of a portion of a super junction semiconductor device in accordance with another embodiment providing a variation of the vertical extension of p-type areas.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
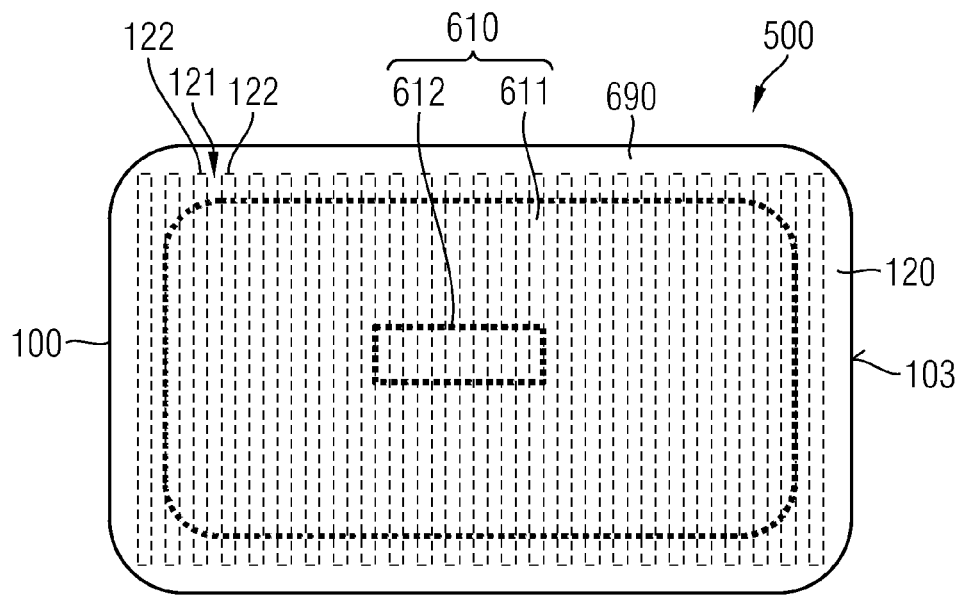
FIG. 1A is a schematic cross-sectional view of a semiconductor device in a plane perpendicular to an on-state current direction in accordance with an embodiment providing a compact second portion of reduced nominal reverse breakdown voltage.

The super junction semiconductor device 500 shown in FIG. 1A includes a semiconductor body 100 with a first and a second surface (not shown) parallel to the cross-sectional plane. The semiconductor body 100 is provided from a single-crystalline semiconductor material, for example silicon Si, silicon carbide SiC, germanium Ge, a silicon germanium crystal SiGe, gallium nitride GaN or gallium arsenide GaAs. A normal to the first and second surfaces and the cross-sectional plane of FIG. 1A defines a vertical direction and directions orthogonal to the normal direction and parallel to the cross-sectional plane of FIG. 1A define lateral directions.

The semiconductor body 100 includes a cell area 610 and an edge area 690 surrounding the cell area 610 in the lateral directions in an outermost section of the semiconductor body 100. The edge area 690 extends along an outer surface 103 connecting the first and second surfaces. A first electrode structure directly adjoins the first surface and a second electrode structure directly adjoins the second surface. The super junction semiconductor device is configured to accommodate a voltage applied between the first and second electrode structures predominantly in a vertical direction perpendicular to the first surface in the cell area 610 and predominantly in a lateral direction parallel to the first surface in the edge area 690.

In a conductive mode of the semiconductor device 500 an on-state current mainly flows between the first and second surfaces 101, 102 in the cell area 610 and no or only a negligible portion of the on-state current flows in the edge area 690. Such source zones of IGFETs or IGBTs, which are electrically connected to a source terminal of the semiconductor device 500, are exclusively formed within the cell area 610 and are absent in the edge area 690. Insofar impurity zones similar to the source zones are formed in the edge area 690 they are not electrically connected to the source terminal or are not effective as source zones of a field effect transistor structure for other reasons, for example, no gate electrode is provided or controllable such that an on-state or forward current flows through the respective impurity zone in the conductive mode.

In a drift layer 120 of the semiconductor body 100 a super junction structure is formed that includes first areas 121 of a first conductivity type and second areas 122 of a second conductivity type which is the opposite of the first conductivity type, wherein first and second areas 121, 122 alternate along at least one lateral direction. The cross-sectional areas of the second areas 122 in the cross-sectional plane may be circles, ellipsoids, ovals, hexagons, or rectangles, e.g. squares, with or without rounded corners. The first areas 121 may be segments of a grid embedding the second areas 122.

According to the illustrated embodiment, the first and second areas 121, 122 are parallel stripes, which may be arranged at regular distances. The first and second areas 121, 122 may be formed mainly in the cell area 610 and may extend into adjoining inner portions of the edge area 690. Further first and second areas 121, 122 may be provided exclusively in the edge area 690.

In a first portion 611 of the cell area 610, the super junction structure has a first nominal breakdown voltage. In a remaining second portion 612 of the cell area 610 the super junction structure has a second nominal breakdown voltage that is lower than the first nominal breakdown voltage.

The breakdown voltage of the cell area 610 or a portion thereof is a known function of the impurity distributions and the geometry parameters of the super junction structure. The nominal breakdown voltage of the cell area 610 or a portion thereof is that breakdown voltage that results from the target geometry parameters and the target impurity distributions for the super junction structure. Due to process-induced inhomogeneities, the actual breakdown voltage of an arbitrary portion of the cell area 610 may deviate from the nominal breakdown voltage.

When in a conventional device a controlled avalanche breakthrough has been triggered, e.g. in an unclamped inductive switching environment, the position at which the avalanche breakdown occurs in the cell area 610 depends on the homogeneity of the geometry parameters and impurity quantities. If the homogeneity is high the generated charge carriers and the off-state current may uniformly distribute over the whole cell area 610 and the thermal stress disperses over a comparatively large area. If the homogeneity is low the generated charge carriers and the off-state current concentrate at few spots resulting in high thermal stress in comparatively narrow areas. The local thermal stress may destroy a portion of the cell area 610 such that the device characteristics gradually or abruptly degrade. As a consequence, the avalanche ruggedness often depends on process parameters that cannot fully be controlled in an economic way.

With the super junction semiconductor device 500 the area in which the avalanche breakdown occurs is in substance defined by the well-defined second portion 612. According to an embodiment, the difference in the nominal breakdown voltages among the first and second portions 611, 612 is higher than an estimated variation of the actual breakdown voltage in the first portion 611. For example, the second nominal breakdown voltage is at most 90% of the first nominal breakdown voltage. As a result approximately no avalanche effect occurs in the first portion 611.

The difference between the first and the second nominal breakdown voltages may be selected such that at least 50% of the mobile charge carriers generated in the avalanche breakdown are generated in the second portion 612. The second portion 612 may cover at least 5% and at most 80%, for example approximately 10% to 20% of the cell area 610. Proximity effects provoke geometry fluctuations close to the edge of the cell area 610. For example, an excess of an etchant near the outer surface 103 may result in that close to the outer surface 103 etched trenches and areas obtained by filling the etched trenches are wider and/or deeper than in a central portion of the semiconductor body 100. According to an embodiment, the second portion 612 may be spaced from the edges of the cell area 610. As a result, in the second portion 612 the geometry parameters and impurity distributions are more uniform and the avalanche effect disperses uniformly in the second portion 612.

The cross-sectional area of the second portion 612 may be significantly narrower than the cell area 610, for example at most 15% of the cell area 610. Since less process inhomogeneities occur in a narrower area than in a wider area, the avalanche behavior is more rugged. The cross-sectional area of the second portion 612 may be at least 2% of the cell area 610 such that in the avalanche breakdown charge carrier generation and off-state current extend over a sufficiently large area to avoid spots of excessive heat.

The second portion 612 may be provided in portions of the cell area 610 that dissipate thermal energy at best. According to an embodiment, the second portion 612 has a single partition in the vertical projection of center portions of metallic electrodes provided on the first and second surfaces. For example, the second portion 612 may be provided in a central portion of the cell area 610 or the semiconductor body 100 at a distance to the edge area 690 such that a higher amount of power can be dissipated without irreversibly destroying transistor cells. Proximity effects can be avoided.

Other embodiments may provide a segmented second portion 612 with two of more spatially spaced segments. Concentrating the avalanche effect in a region with sufficient heat dissipation further improves avalanche ruggedness. The cross-section of the second portion 612 may be a circle, an ellipsoid, an oval, a hexagon, or a rectangle, e.g. a square.

Figure 1B:
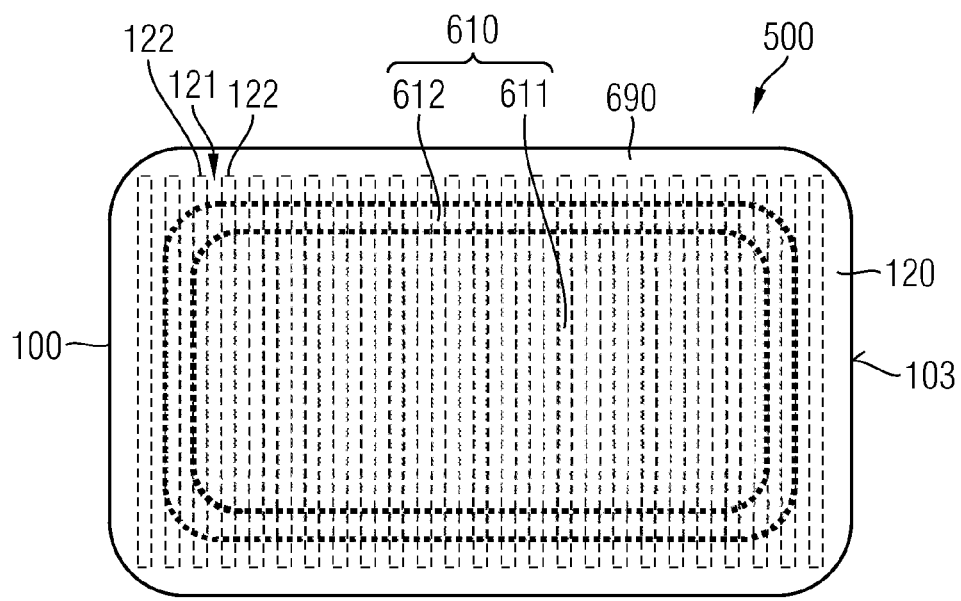
FIG. 1B is a schematic cross-sectional view of a semiconductor device in a plane perpendicular to the on-state current direction in accordance with an embodiment providing a circular second portion of reduced nominal reverse breakdown voltage.

FIG. 1B shows a circular second portion 612. The circular second portion 612 may be an outer portion of the cell area 610 adjoining the edge area 690 directly or through a transition area. Since the second portion 612 includes the areas affected by proximity effects, the remaining first portion 611 is more uniform. A small difference in the nominal breakdown voltages of the first and second portions 611, 612 may suffice to concentrate the avalanche breakdown in the second portion 612. Another embodiment may provide a circular first portion 611 surrounding the remaining second portion 612.

Figure 1C:
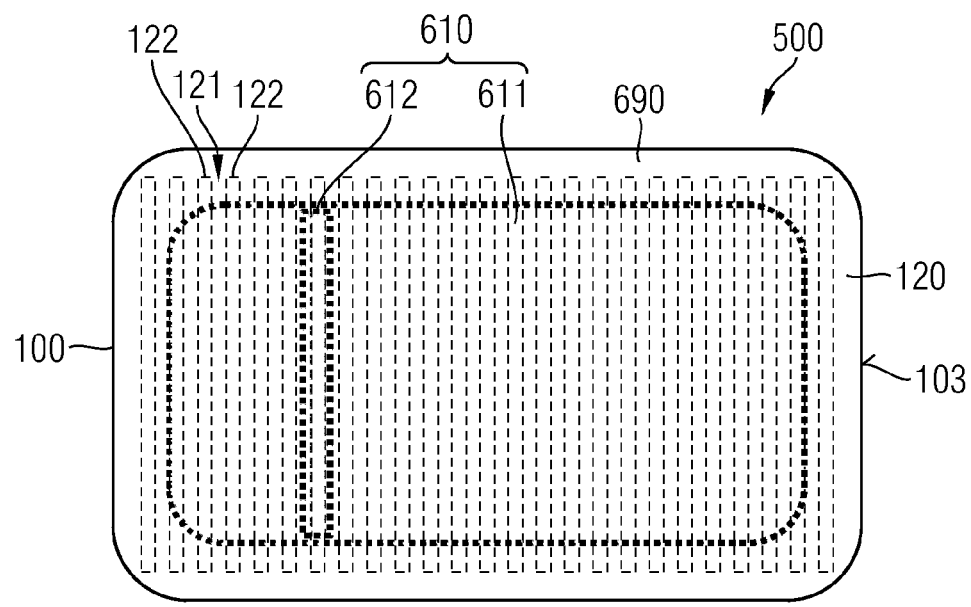
FIG. 1C is a schematic cross-sectional view of a semiconductor device in a plane perpendicular to the on-state current direction in accordance with an embodiment providing a one-part second portion of reduced nominal reverse breakdown voltage oriented along one area.

FIG. 1C shows a stripe-shaped second portion 612 including one complete second area 122. According to other embodiments, the stripe-shaped second portion 612 may include a complete first area 121 or more than one directly adjoining first and second areas 121, 122 in the cell area 610. Formation of the second portion 612 may be easily combined with the formation of the areas 121, 122.

Figure 1D:
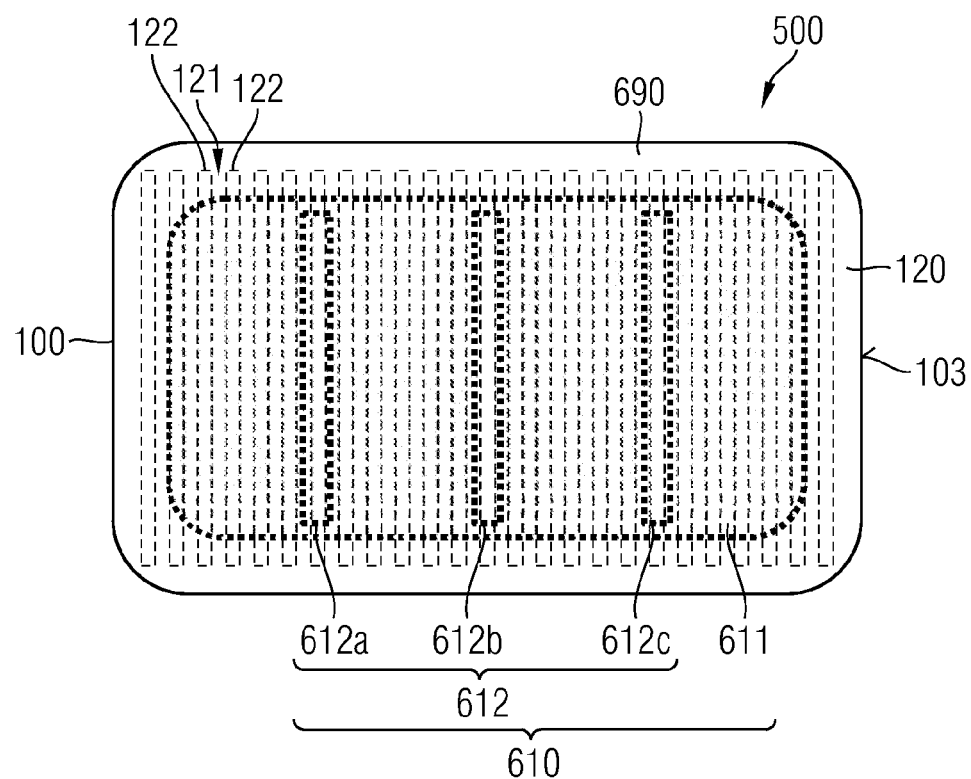
FIG. 1D is a schematic cross-sectional view of a semiconductor device in a plane perpendicular to the on-state current direction in accordance with an embodiment providing a segmented second portion of reduced nominal reverse breakdown voltage oriented along areas.

FIG. 1D provides a segmented second portion 612 with spatially spaced segments 612a, 612b, 612c, wherein each segment 612a, 612b, 612c includes one or more complete areas 121, 122. The segments 612a, 612b, 612c may be equally spaced to distribute the thermal stress.

Figure 2:
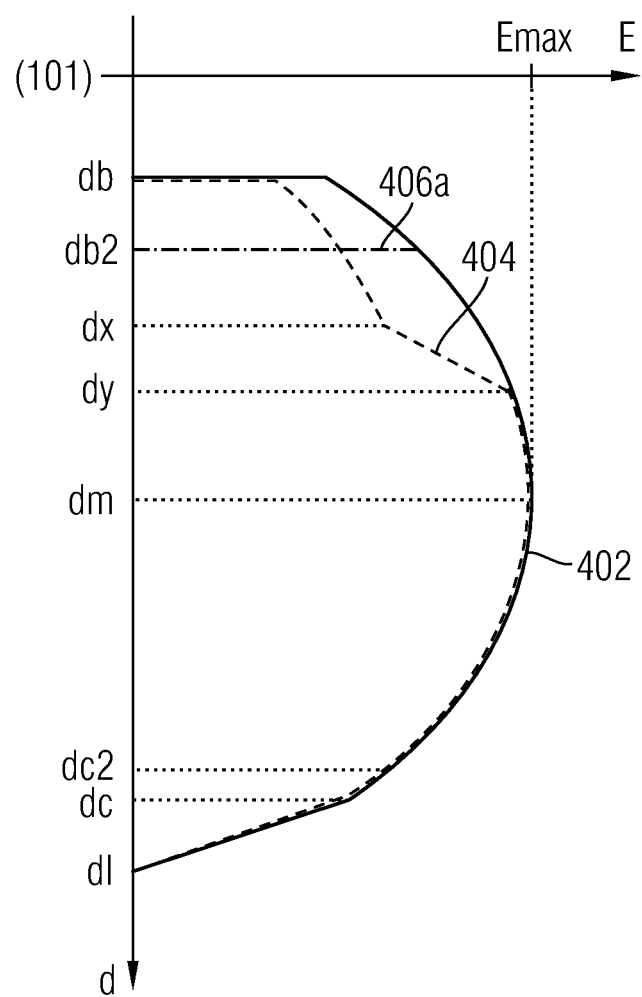
FIG. 2 is a schematic diagram of electric field profiles for discussing background information helpful for the understanding of the embodiments.

FIG. 2 illustrates approaches for achieving two different nominal breakdown voltages in the first and second portions 611, 612. The diagram shows a first electric field profile (distribution) 402 along the vertical direction in a semiconductor body of a conventional semiconductor device, which may correspond to the electric field profile in the first or the second portion 611, 612 of the cell area 610 of a semiconductor device 500 according to the embodiments.

Approximately, the electric field extends between a first end of the super junction structure defined by an interface to a body zone at a distance db to the first surface 101 and a heavily doped impurity layer 130 formed between the super junction structure and the second surface at a distance dl. In the depletion mode of an n-FET, with increasing distance to the first surface 101a compensation ratio (degree of compensation) may change from lightly p-loaded to lightly n-loaded within the super junction structure such that the electric charges of stationary charge carriers in the first and second areas do not perfectly compensate for each other and the electric field gradually increases in a p-loaded section oriented to the first surface 101 up to a maximum electric field strength Emax at dm and decreases in an n-loaded section between dm and a second end of the super junction structure oriented to the second surface at a distance dc. Between the super junction structure and the impurity layer at dl the electric field strength decreases steeply, e.g. approximately linearly in case of a uniform impurity distribution in the portion of the drift layer between the super junction structure and the impurity layer. The integral over the electric field strength between db and dl gives the nominal breakdown voltage the semiconductor device accommodates. The concentration of the maximum electric field strength in a small region around dm allows, up to a certain degree, the avalanche breakdown to be confined around dm such that a semiconductor device having the vertical electric field profile 402 exhibits some avalanche ruggedness.

According to the embodiments, the compensation between the first and second areas in the super junction structure in a vertical sub section of the super junction structure between a distance dx and a distance dy is de-tuned to a higher degree in one of the first and second portions 611, 612 of the cell area 610 than in the other one of the first and second portions 611, 612.

According to an embodiment, the first portion 611 shows an electric field profile similar to profile 402, whereas in the second portion 612 the compensation is stronger de-tuned by increasing the p-load in the p-loaded section and/or increasing the n-load in the n-loaded section. Both results in lowering the electric field strength in the respective section and as a consequence lowering the nominal breakdown voltage in the second portion 612. According to another embodiment, the second portion 612 shows an electric field profile similar to profile 402, whereas in the first portion 611 the compensation is stronger de-tuned by decreasing the p-load in the p-loaded section and/or decreasing the n-load in the n-loaded section. Both results in lifting the electric field strength in the respective section and as a consequence increasing the nominal breakdown voltage in the first portion 611.

In FIG. 2, a second profile 404 results from an area of additionally de-tuned compensation in the second portion between dx and dy. Since the maximum electric field strength remains the same, the area enclosed by the second profile 404 is smaller than the area enclosed by the first profile 402. Hence the nominal breakdown voltage in the second portion 612 is lower than in the first portion 611 having the first profile 402. The region in which avalanche breakdown occurs is in addition laterally confined to the second portion 612, whereas conventional semiconductor devices with the vertical profile 402 in the complete cell area 610 confine the avalanche breakdown only vertically around dm.

In the first portion 611 the vertical electric field profile of the super junction structure may have a shallow peak. For example, the vertical electric field profile may have a parabolic gradient with a maximum value Emax within the super junction structure as shown by profile 402. According to another example, with increasing distance to the first surface the vertical electric field profile linearly increases up to Emax and linearly decreases from Emax as shown by profile 404.

According to a further embodiment, the electric field profile of the first portion is flat or at least approximately flat to benefit from perfect compensation, whereas the second portion may have a peak providing a vertical confinement of the avalanche.

According to another embodiment, a vertical extension across which the electric field extends in the reverse mode is narrower in the second portion 612 than in the first portion 611. A resulting profile encloses a smaller area than the first profile 402. For example a heavily p-doped zone between db and db2 may result in the third profile 406a shown in FIG. 2 in the second portion 612. As a result, the nominal breakdown voltage in the second portion 612 is lower than in the first portion 611.

The approaches are applicable for super junction devices obtained by both multi-layer epitaxy methods and trench methods obtaining the super junction structure by etching trenches into a semiconductor body and forming the first and second areas oriented along the trenches.

Figure 3A:
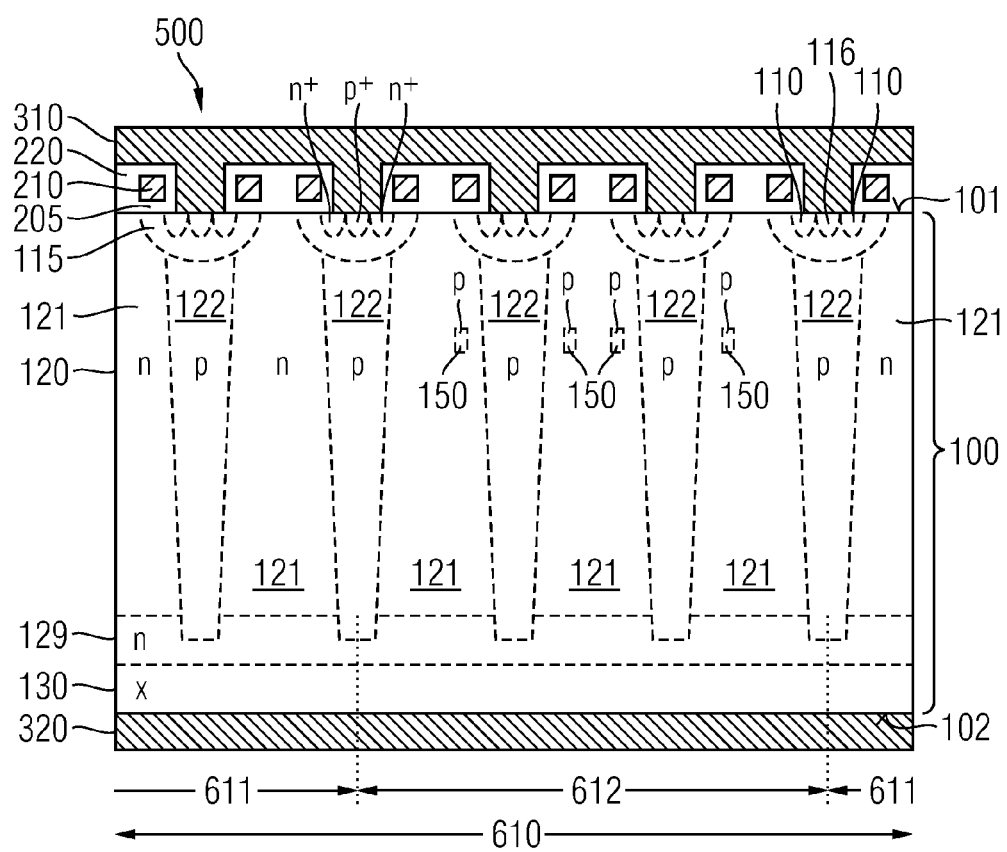
FIG. 3A is a schematic cross-sectional view of a portion of a super junction semiconductor device in accordance with an embodiment providing modulation of a compensation ratio by p-type impurity zones embedded in n-type areas of a p-loaded section of a super junction structure.

FIG. 3A refers to an embodiment relying on lowering the vertical electric field profile in a p-loaded section by a local de-tuning of the compensation in the super junction structure in the second portion 612. The semiconductor device 500 includes a semiconductor body 100 with parallel first and second surfaces 101, 102. The semiconductor body 100 is provided from a single single-crystalline semiconductor material as described above. In a drift layer 120 of the semiconductor body 100 first areas 121 of the first conductivity type and second areas 122 of the second conductivity type define a super junction structure.

Between the super junction structure and the second surface 102 the semiconductor body 100 includes an impurity layer 130 directly adjoining the second surface 102. A mean net impurity concentration in the impurity layer 130 is comparatively high and may be at least $5 \times 10^{18}$ cm$^{-3}$, by way of example. The impurity layer 130 may extend along a complete cross-sectional plane of the semiconductor body 100 parallel to the second surface 102 at least in a cell area 610. In case the semiconductor device 500 is an IGFET (insulated gate field effect transistor), the impurity layer 130 is a drain layer of the first conductivity type. In case the semiconductor device 500 is an IGBT (insulated gate bipolar transistor), the impurity layer 130 is a collector layer of the second conductivity type. The first and second areas 121, 122 may have the same dimensions in the first and second portions 611, 612, respectively.

The second areas 122 may directly adjoin the impurity layer 130. According to other embodiments, the second areas 122 are arranged at a distance to the impurity layer 130 such that the drift layer 120 includes a continuous portion of the first conductivity type that extends between the end portions of the first and second areas 121, 122 oriented to the second surface 102 on the one hand and the impurity layer 130 on the other hand.

In the drift layer 120, an intermediate layer 129 of the first conductivity type may directly adjoin the impurity layer 130. The intermediate layer 129 may be effective as a field stop layer having a mean net impurity concentration that is higher than in the first areas 121 and lower than in the impurity layer 130. The mean net impurity concentration in the intermediate layer 129 may be at least 10 times the mean net impurity concentration in the first area 121 and at most a tenth of the mean net impurity concentration in the drain layer 130. For example, the mean net impurity concentration in an intermediate layer 129 effective as field stop may be at least $5 \times 10^{16}$ cm$^{-3}$ and at most $5 \times 10^{17}$ cm$^{-3}$.

According to other embodiments, the intermediate layer 129 is effective as a buffer region and has a mean net impurity concentration lower than the mean net impurity concentration in the first areas 121. For example, the mean net impurity concentration in the first areas 121 is at least twice the mean net impurity concentration in the intermediate layer 129.

The interfaces between the first and second areas 121, 122 may result from a trench etch and may be straight and non-undulated. According to embodiments referring to stripe-shaped areas 121, 122, the interfaces between the first and second areas 121, 122 may be planar (plane) surfaces. According to an embodiment the interfaces between the first and second areas 121, 122 may be approximately vertical. Along the vertical direction, the impurity concentrations in the first and second areas 121, 122 may be uniform resulting in a flat vertical electric field gradient. According to another example, the impurity concentrations in the first areas 121, the second areas 122 or both may change along the vertical direction, wherein a compensation changes from p-loaded to n-loaded for n-FETs or vice versa for p-FETs resulting in a vertical electric field profile with a peak value. The vertical impurity concentration profile may include one or more steps resulting in a vertical electric field profile with linearly increasing and decreasing sections. According to other embodiments, the impurity concentration in the first areas 121, the second areas 122 or both may decrease or increase linearly resulting in parabolic electric field gradients.

The illustrated embodiment refers to homogenously doped first and second areas 121, 122, wherein the second areas 122 taper with increasing distance to the first surface 101. The impurity concentrations in and the dimensions and taper angle of the first and second areas 121, 122 may be determined such that a first section of the super junction structure oriented to the first surface 101 is p-loaded and a remaining second section is n-loaded resulting in an approximately parabolic vertical electric field profile similar to the electric field profile 402 in FIG. 2.

The first and second areas 121, 122 may directly adjoin to each other. According to another embodiment, a dielectric liner may separate the first and second areas 121, 122 at least along the vertical direction. The first and second areas 121, 122 may be part of a layered compensation structure lining at least sidewalls of trenches in an intrinsic, lightly n-doped or lightly p-doped drift layer 120, wherein the compensation structure may include further doped and intrinsic layers, for example an intrinsic layer separating the layer-like first and second areas 121, 122. The trenches lined by the compensation structure may be filled with a dielectric material or an intrinsic, lightly n-doped or lightly p-doped semiconductor material.

According to another embodiment the first or the second areas 121, 122 form or are part of a layered structure lining at least sidewalls of trenches in the drift layer 120, wherein the others of the first and second areas 121, 122 may be formed as a matrix-like impurity zone in the drift layer 120. Each of the described configurations for the first and second areas 121, 122 can be combined with any of the approaches for additional implant zones 150 as discussed with reference to the following Figures.

The semiconductor body 100 includes body zones 115 of the second conductivity type. Each body zone 115 is structurally and electrically connected to one of the second areas 122 and is arranged in the vertical projection of the respective second area 122 between the first surface 101 and the respective second area 122.

Source zones 110 of the first conductivity type may be embedded in the body zones 115 and may directly adjoin the first surface 101. Heavily doped contact zones 116 of the second conductivity type may be provided between the first surface 101 and the body zones 115.

The source zones 110 may be exclusively formed within the cell area 610 and may be absent in the edge area 690 surrounding the cell area 610. The body zones 115 are provided at least in the cell area 610 and may or may not be absent in the edge area 690.

Gate dielectrics 205 electrically separate gate electrodes 210 and neighboring portions of the body zones 115. A potential applied to the gate electrodes 210 capacitively controls a minority charge carrier distribution in a channel portion of the body zones 115 directly adjoining the gate dielectrics 205 between the source zones 110 and the corresponding first areas 121 such that in a conductive state of the semiconductor device 500 an on-state current flows through a conductive channel formed by strong inversion in the channel portion and through the drift layer 120 between the source zones 110 and the impurity layer 130 in the cell area 610.

The gate electrodes 210 may be arranged above the first surface 101. According to other embodiments, the gate electrodes 210 may be arranged in gate trenches introduced into the semiconductor body 100 in the vertical projection of the first areas 121.

A first electrode structure 310 may be electrically connected to the source zones 110 and the body zones 115 in the cell area 610 through openings in a dielectric layer 220 that covers and encapsulates the gate electrodes 210. The openings in the dielectric layer 220 are provided between neighboring gate electrodes 210. The contact zones 116 may ensure a low-ohmic electric connection between the first electrode structure 310 and the body zones 115. The dielectric layer 220 electrically insulates the first electrode structure 310 from the gate electrodes 210. A second electrode structure 320 directly adjoins the impurity layer 130.

In the conductive state or on state, a current flows in an approximately vertical direction between the first electrode structure 310 and the second electrode structure 320 in the cell area 610. Nearly no on-state current flows in the edge area 690 because of the lack of source zones 130 that are connected to the first electrode structure 310.

Each of the first and second electrode structures 310, 320 may consist of or contain, as main constituent(s) aluminum Al, copper Cu, or alloys of aluminum or copper, for example AlSi, AlCu or AlSiCu. According to other embodiments, one or both of the first and second electrode structures 310, 320 may contain, as main constituent(s), nickel Ni, titanium Ti, silver Ag, gold Au, platinum Pt and/or palladium Pd. For example, at least one of the first and second electrode structures 310, 320 includes two or more sub-layers, each sub-layer containing one or more of Ni, Ti, Ag, Au, Pt, and Pd as main constituent(s), e.g. silicides and/or alloys.

According to the illustrated embodiment, the first conductivity type is the n-type, the second conductivity type is the p-type, the first electrode structure 310 is a source electrode and the second electrode structure 320 is a drain electrode. According to other embodiments, the first conductivity type is the p-type.

The embodiment of FIG. 3A shows additional implant zones 150 in the second portion 612 which have no counterpart in the first portion 611. The additional implant zones 150 increase the p-load in the p-loaded section of the super junction structure thereby locally lowering the vertical electric field strength and the nominal breakdown voltage in the second portion 612 with regard to the first portion 611. The additional implant zones 150 may be provided as counter implants in the first areas 121 or may be provided as zones of increased net impurity concentration in the second areas 122. According to the illustrated embodiment the additional implant zones 150 are provided in the first areas 121. They may be provided in the second areas 122 as well.

In the first areas 121, the counter implant at least partially compensates the impurity concentration of the first conductivity type in the first areas 121 locally. According to an embodiment the counter implant locally overcompensates the impurities of the first conductivity type such that the additional implant zones 150 have the opposite, second conductivity type.

According to an embodiment, the additional implant zones 150 may be formed by (i) growing a first section of the drift layer 120 by epitaxy, wherein the first section may be in-situ doped according to the first conductivity type, (ii) implanting impurities of the second conductivity type in regions of the first section that are provided for the formation of the first areas 121 only in the second portion 612, (iii) growing a remaining second section of the drift layer 120 by epitaxy, (iv) etching trenches into the drift layer 120, the trenches extending through the second section of the drift layer 120 into the first section and (v) forming p-doped second areas 122 in the trenches, e.g. by an epitaxy process.

With the additional implant zones 150, an impurity concentration profile in the second portion 612 differs from a corresponding impurity concentration profile in the first portion 611. Starting from the vertical pn-junctions between the first and second areas 121, 122, with increasing reverse voltage depletion zones grow in the lateral direction until the super junction structure is completely depleted from mobile charge carriers. At vertical sections providing perfect compensation, the charges of the remnant immobile charge carriers in the first and second areas 121, 122 may completely compensate each other such that the electric field strength does not change over the concerned vertical section of the super junction structure. By contrast, where no perfect compensation is achieved, the non-compensated charges of the remnant immobile charge carriers lower the electric field strength. The integral over the electric field strength is lowered and a lower nominal breakdown voltage is achieved for the second portion 612 than for the first portion 611. The second portion 612 has a second nominal reverse breakdown voltage that is lower than the nominal reverse breakdown voltage in the first portion 611. The additional implant zones 150 are provided in a p-loaded section of the super junction structure oriented to the first surface 101

Figure 3B:
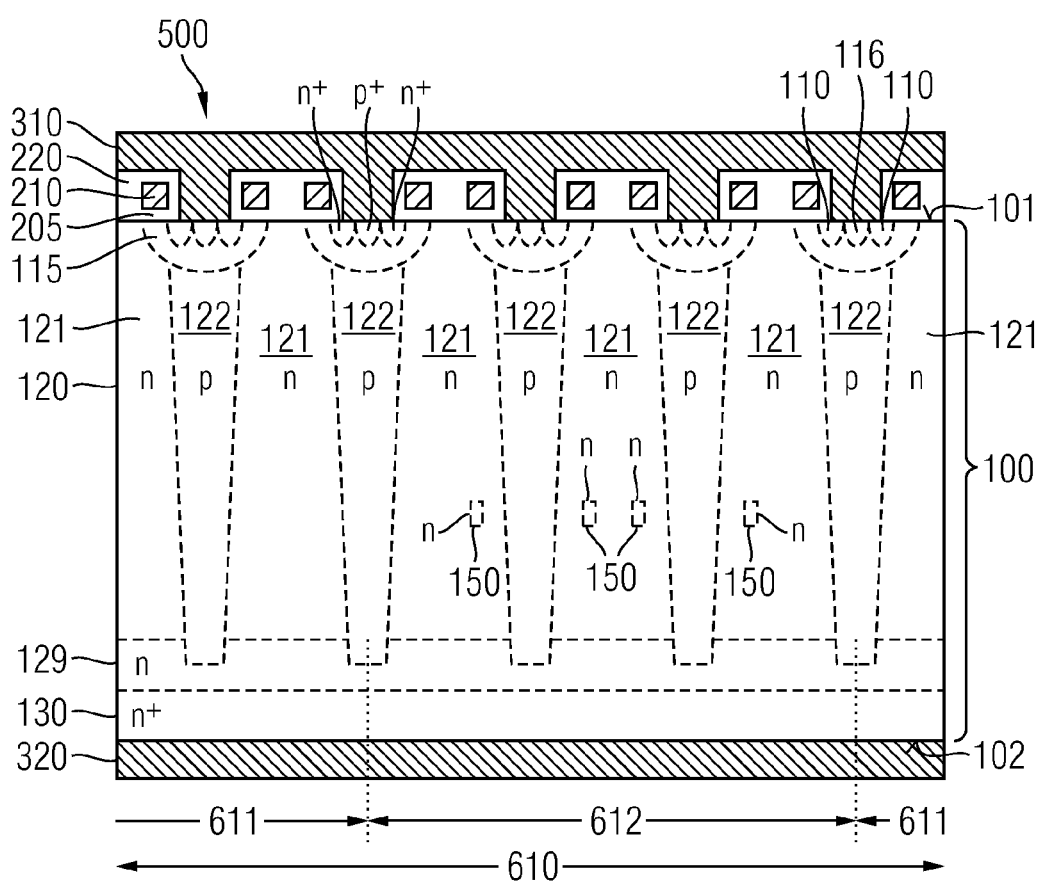
FIG. 3B is a schematic cross-sectional view of a portion of a super junction semiconductor device in accordance with an embodiment providing modulation of a compensation ratio by n-type impurity zones embedded in n-type areas of an n-loaded section of a super junction structure.

The embodiment of FIG. 3B differs from the embodiment of FIG. 3A in that the additional implant zones 150 are provided from additional n-type impurities in the n-loaded section of the super junction structure. The n-type impurities may counter the p-type impurities in the second areas 122, wherein the n-type impurities either locally reduce the p-type net impurity concentration or locally compensate or overcompensate the p-type impurities to form intrinsic or n-type additional impurity zones 150 in the second areas 122. According to the illustrated embodiment, the n-type impurities locally increase the n-type net impurity concentration within the first areas 121.

FIGS. 3A and 3B refer to embodiments forming the second portion 612, which has the lower nominal breakdown voltage, by introducing impurities into the second portions 612.

Figure 3C:
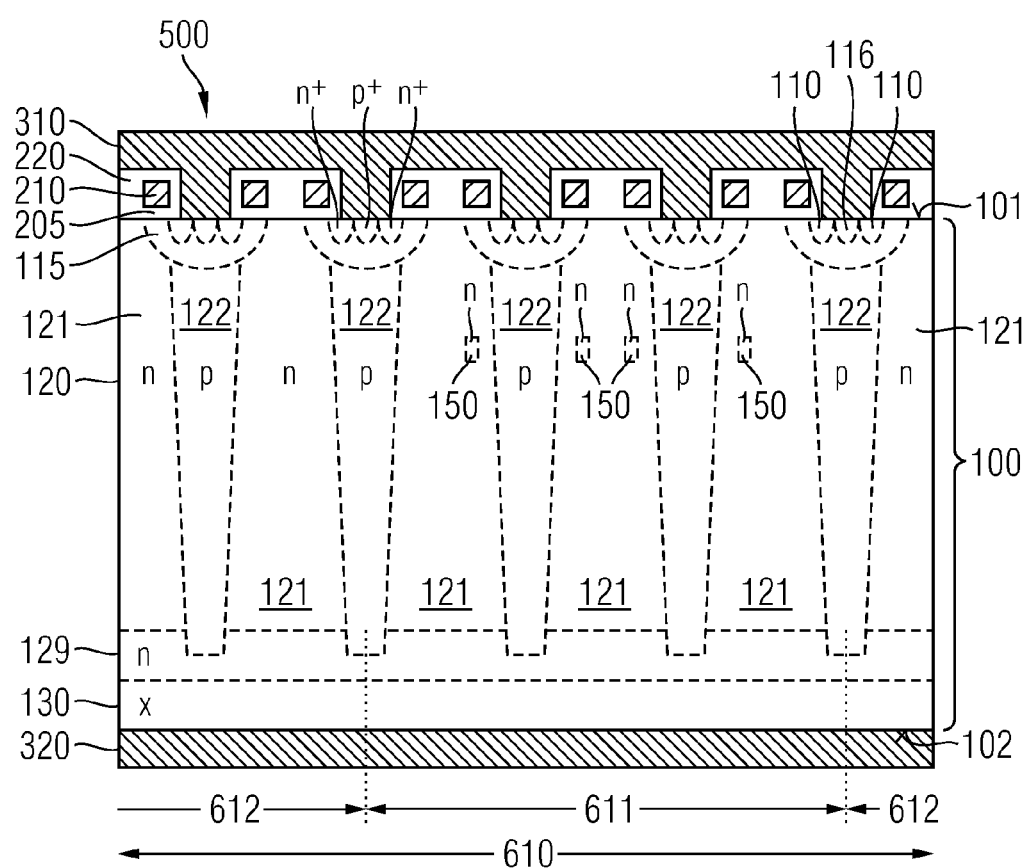
FIG. 3C is a schematic cross-sectional view of a portion of a super junction semiconductor device in accordance with an embodiment providing modulation of the compensation ratio by n-type impurity zones embedded in n-type areas of a p-loaded section of a super junction structure.

FIG. 3C refers to an embodiment forming the second portion 612, which has the lower nominal breakdown voltage, by introducing impurities into the first portion 611. Locally introducing additional n-type impurities into the p-loaded section of the first portion 611, either into the first areas 121 as illustrated or into the second areas 122, locally lifts the vertical electric field strength and results in a higher nominal breakdown voltage in the first portion 611. A similar effect can be achieved by introducing additional p-type impurities into the n-loaded section of the first portion 611, either into the first areas 121 or into the second areas 122.

Introducing locally n-type impurities into the n-type first areas 121 and p-type impurities into the p-type second areas 122 does not adversely affect the on-state resistance of the semiconductor device 500.

Figure 3D:
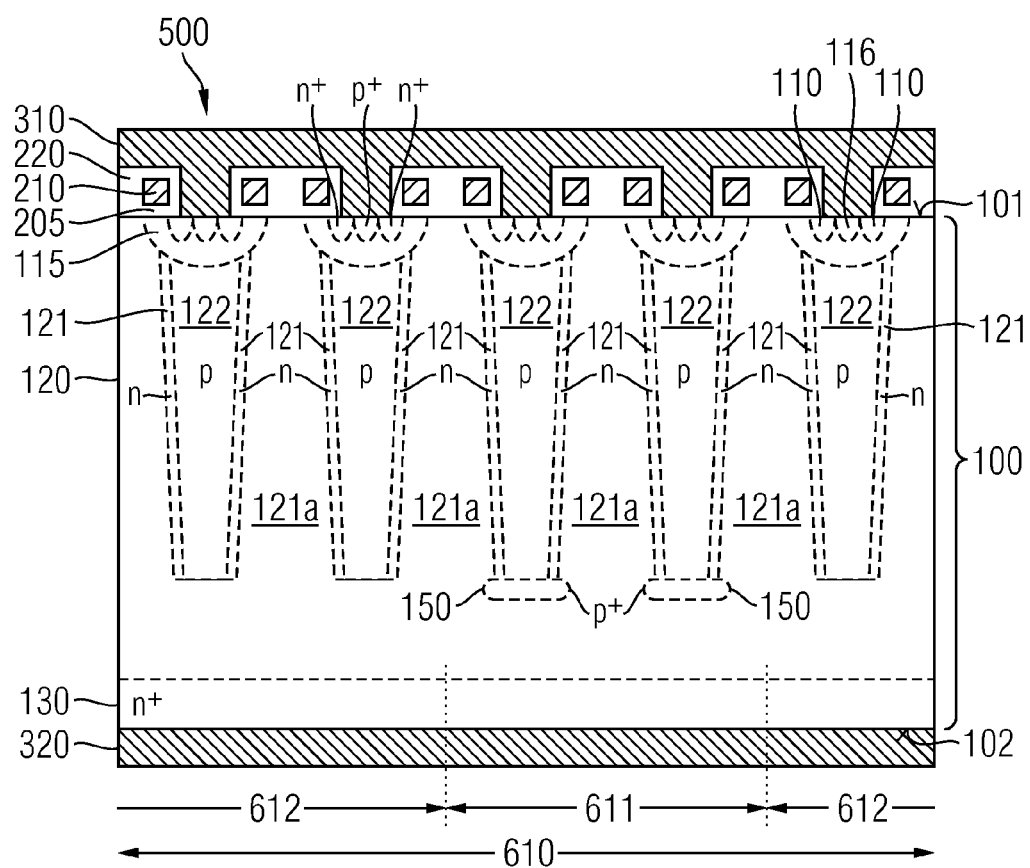
FIG. 3D is a schematic cross-sectional view of a portion of a super junction semiconductor device in accordance with an embodiment providing modulation of the compensation ratio by p-type impurity zones at an n-loaded side of a super junction structure.

FIG. 3D refers to an embodiment providing modulation of the electric field profile by additional implant zones 150 between the second areas 122 and the impurity layer 130 in the first portion 611. The additional implant zones 150 may be formed by an implant through the bottom of trenches formed in the semiconductor body 100 for forming at least the second areas 122. The additional implant zones 150 of the p-type in the n-loaded lower section of the super junction structure lift the vertical electric field strength and the nominal breakdown voltage with regard to the second portions 612 lacking the additional implant zones 150.

According to FIG. 3E additional implant zones 150 of the n-type are provided between the second areas 122 and the impurity layer 130 in the second portion 612. The additional implant zones 150 of the n-type in the n-loaded lower section of the super junction structure lower the vertical electric field strength and the nominal breakdown voltage with regard to the first portion 611 lacking the additional implant zones 150.

Figure 4A:
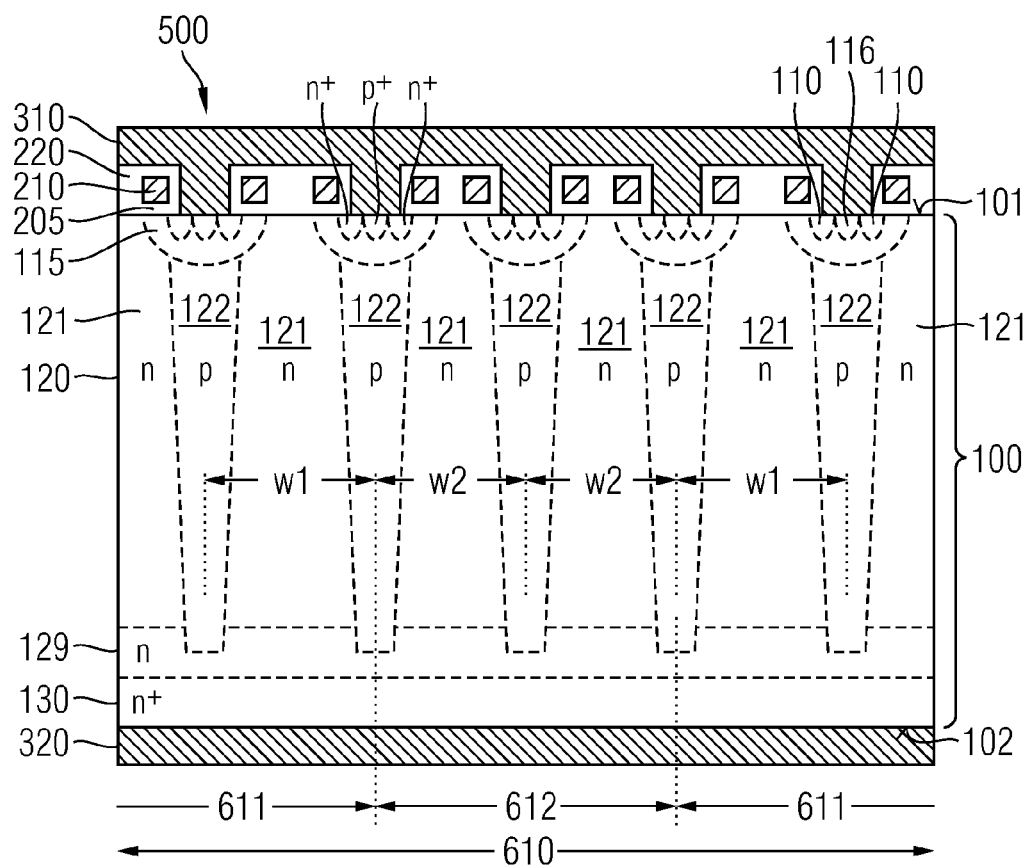
FIG. 4A is a schematic cross-sectional view of a portion of a super junction semiconductor device in accordance with an embodiment providing a variation of the distance between p-type areas.

FIG. 4A shows a super junction semiconductor device 500 with a first portion 611 in which a distance w1 between neighboring second areas 122 is wider than a corresponding distance w2 in the remaining second section 612 of the cell area 610. At uniform impurity concentrations in the first and second areas 121, 122, the tapered second areas 122 provide a parabolic vertical electric field profile as shown in FIG. 2 in both the first and second portions 121, 122. The smaller distance between the second areas 122 in the second portion 612 may provide a higher p-load in both the p-loaded and the n-loaded section, wherein in total the lowering of the electric field strength in the p-loaded section may overcompensate a lifting of the electric field strength in the n-loaded section such that the nominal breakdown voltage in the second portion 612 is lower than in the first portion 611.

Figure 4B:
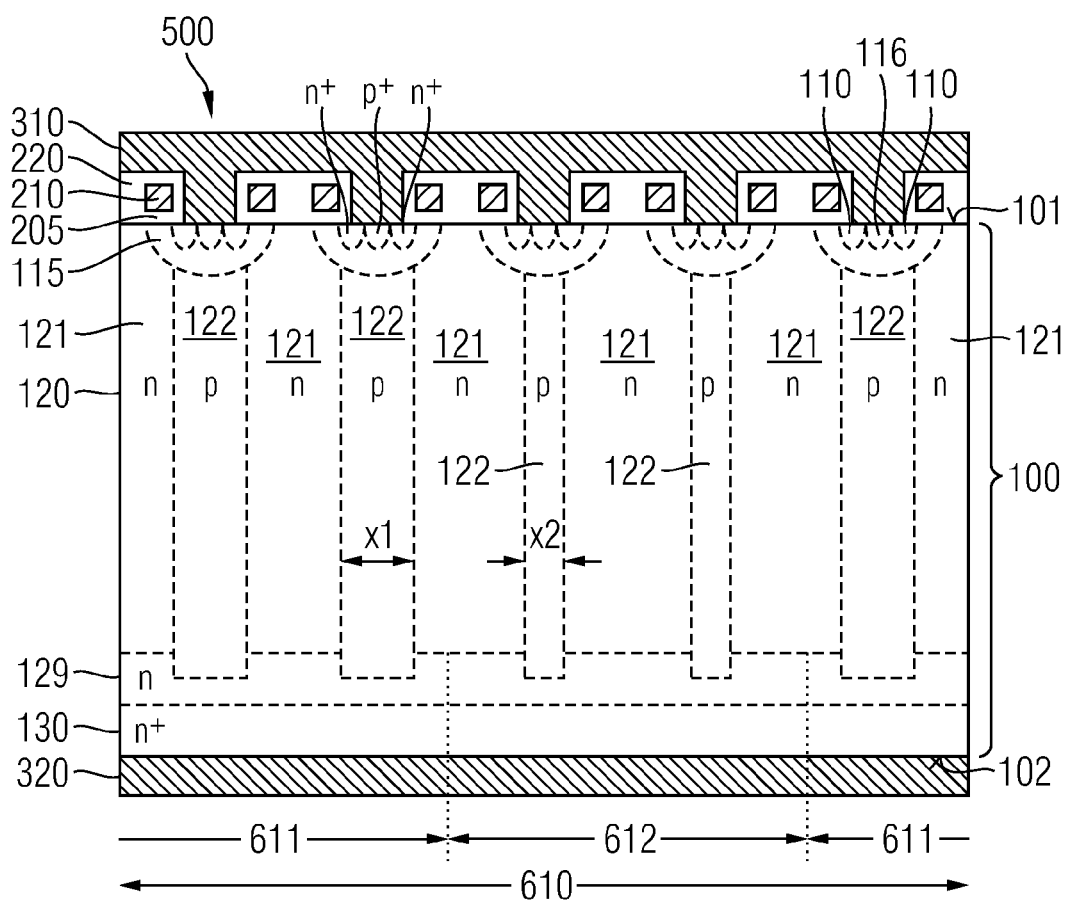
FIG. 4B is a schematic cross-sectional view of a portion of a super junction semiconductor device in accordance with an embodiment providing a variation of the width of p-type areas.

FIG. 4B refers to an embodiment where the second areas 122 are narrower in the second portion 612 than in the remaining first portion 611 of the cell area 610. For example, a first width x1 of stripe-shaped second areas 122 in the first portion 611 exceeds a second width x2 of stripe-shaped second areas 122 in the second portion 612. As a result, the electric field profile in the second portion 612 differs from the electric field profile in the first portion 611.

FIG. 4C refers to an embodiment where the second areas 122 are wider in the second portion 612 than in the remaining first portion 611 of the cell area 610 resulting in that impurities of the second conductivity type dominate in the super junction region of the second portion 612. For example, the first width x1 of stripe-shaped second areas 122 in the first portion 611 is narrower than the second width x2 of the stripe-shaped second areas 122 in the second portion 612. As a result, the electric field profile in the second portion 612 differs from the electric field profile in the first portion 611.

Figure 5A:
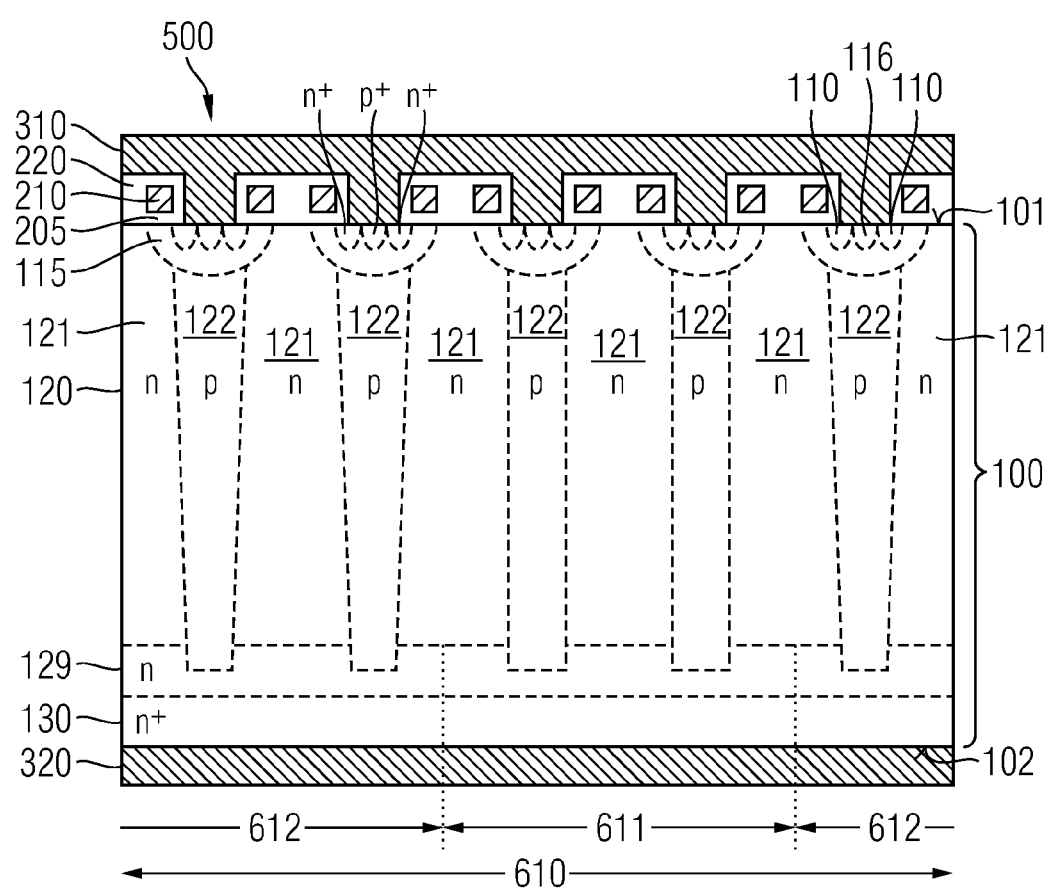
FIG. 5A is a schematic cross-sectional view of a portion of a super junction semiconductor device in accordance with an embodiment providing a variation of the slope angle of p-type areas.

FIG. 5A shows a super junction semiconductor device 500 where the second areas 122 are provided steeper in the first portion 611 than in the second portion 6121. The cross-sectional areas of the second areas 122 in the cross-sectional plane may be equal or may differ between the first and second portions 121, 122. The compensation ratio is more de-tuned in the second portion 612 than in the first portion 611 such that in the n-loaded portion of the super junction structure oriented to the second surface 102 the second portion 612 contains more n-type impurities than the first portion 611. The vertical electric field strength is locally decreased resulting in a lower nominal breakdown voltage in the second portion 612 compared to that in the first portion 611.

FIG. 5B shows an embodiment with the second areas 122 in the second portion 612 being less steep than the second areas 122 in the first portion 611. In the n-loaded portion of the super junction structure oriented to the second surface 102, the second portion 122 contains less p-type impurities such that the vertical electric field strength is locally reduced. As a result the nominal breakdown voltage is lower in the second portion 612 than in the first portion 611.

According to FIG. 6A second areas 122 in the second portion 612 have a vertical extension that is shorter than the vertical extension of the second areas 122 in the first portion 611 by a distance dd. Either the first or the second areas 121, 122 or both may have a non-flat vertical impurity concentration gradient to provide a p-loaded section oriented to the first surface and an n-loaded section oriented to the second surface 102. In the section dd, the n-loaded portion of the super junction structure contains more n-type impurities in the second portion 612 than in the first portion 611. The vertical electric field strength is locally decreased resulting in a lower nominal breakdown voltage in the second portion 612 compared to that in the first portion 611.

Instead of increasing the n-load in the n-loaded section as discussed in FIG. 6A, the embodiment of FIG. 6B provides increasing the p-load in the p-loaded section by additional p-type impurity zones 150 at the interface between the second areas 122 and the body zones 115 in the second portion 612.

Figure 7:
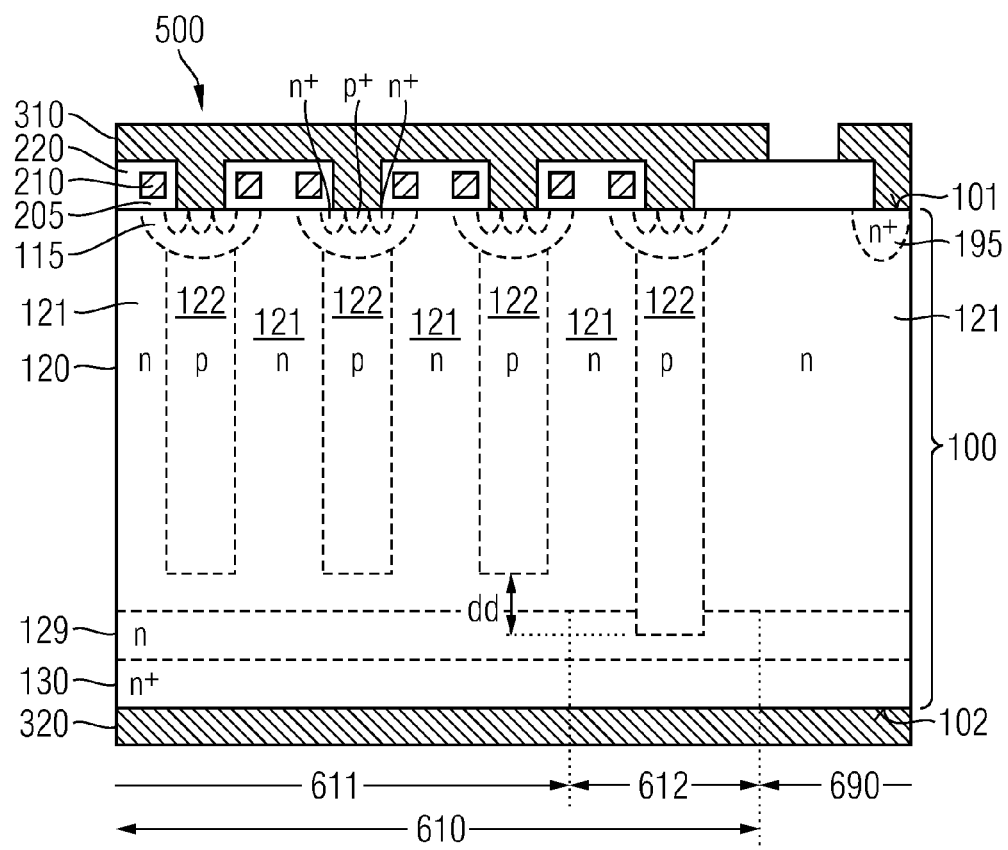
FIG. 7 is a schematic cross-sectional view of a portion of a super junction semiconductor device in accordance with an embodiment providing a variation of the vertical extension of p-type areas close to an edge area.

In the semiconductor device 500 of FIG. 7 an edge area 690 surrounds the cell area 610. The edge area 690 is not active, i.e. no or only a small current flows between the first and second surfaces 101, 102 in the conductive state. The edge area 690 may include edge termination structures, for example a channel stop implant 195. The nominal reverse breakdown voltage is high in a first portion 611 of a cell area 610 directly adjoining the edge area 690 and low in a second portion 612 in the center of the cell area 610. For example, the first portion 611 may be formed oriented along the outermost second area(s) 122 of the cell area 610. According to an embodiment a circular second area 122 surrounds the second portion 612. The outermost second area or areas 122 may have a greater vertical extension than the second areas 122 in the second portion 612. Either the first or the second areas 121, 122 or both may have a non-flat vertical impurity concentration gradient to provide a p-loaded section oriented to the first surface 101 and an n-loaded section oriented to the second surface 102.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A super junction semiconductor device, comprising:
a super junction structure formed in a semiconductor body with a first surface and a second surface parallel to the first surface, the super junction structure comprising first areas of a first conductivity type and second areas of a second conductivity type opposite the first conductivity type, each second area directly structurally connected with a body zone of the second conductivity type; and
a first electrode structure directly adjoining the first surface and a second electrode structure directly adjoining the second surface, the first electrode structure being electrically connected with source zones that are embedded in the body zones in each of first and second portions of a cell area,
wherein the super junction semiconductor device is configured to accommodate a voltage applied between the first and second electrode structures predominantly in a vertical direction perpendicular to the first surface in the cell area and predominantly in a lateral direction in an edge area surrounding the cell area,
wherein in the edge area the source zones are absent or not connected to the first electrode structure,
wherein the super junction structure has a first nominal breakdown voltage in the first portion of the cell area and a second, lower nominal breakdown voltage in the second portion of the cell area by at least one of the following features (i) to (vi): (i) at least one additional implant zone in the second portion of the super junction structure, the at least one additional implant zone having no counterpart in the first portion; (ii) in the second portion each second area has a volume different from a volume of the second areas in the first portion; (iii) in the first portion the second areas have a first cross-sectional area parallel to the first surface and in the second portion the second areas have a second, different cross-sectional area in the same cross-sectional plane; (iv) in the first portion the second areas have a first width and in the second portion the second areas have a second, different width; (v) in the first portion the second areas have a first slope angle with regard to the first surface and in the second portion the second areas have a second, different slope angle; and (vi) in the first portion neighboring ones of the second areas have a first distance to each other and in the second portion neighboring ones of the second areas have a second, different distance to each other.

2. The super junction semiconductor device according to claim 1, further comprising:
an impurity layer of the first or the second conductivity type between the super junction structure and the second surface.

3. The super junction semiconductor device according to claim 1, wherein impurity zones effective as source zones and electrically connected with the first electrode structure are formed in the cell area and are absent in the edge area.

4. The super junction semiconductor device according to claim 1, wherein the first and second areas extend in a vertical direction perpendicular to the first surface and the second areas separate neighboring first areas from each other.

5. The super junction semiconductor device according to claim 1, wherein along a vertical section of the super junction structure a compensation between the first and second areas is stronger de-tuned in one of the first and second portions than in the other.

6. The super junction semiconductor device according to claim 1, wherein an impurity concentration profile in the second portion differs from a corresponding impurity concentration profile in the first portion.

7. The super junction semiconductor device according to claim 6, wherein dimensions of the first and second areas in the second portion are equal to corresponding dimensions of the first and second areas in the first portion.

8. The super junction semiconductor device according to claim 1, wherein the at least one additional implant zone is provided in a central vertical section of the super junction structure at a distance to a first end of the super junction structure oriented to the first surface and at a distance to a second end oriented to the second surface.

9. The super junction semiconductor device according to claim 1, wherein the at least one additional implant zone is provided in the first areas.

10. The super junction semiconductor device according to claim 1, wherein in the second portion a distance across which an electric field extends in a depletion state is shorter than in the first portion.

11. The super junction semiconductor device according to claim 1, wherein the second nominal breakdown voltage is at most 90% of the first nominal breakdown voltage.

12. The super junction semiconductor device according to claim 1, wherein in the second portion a vertical extension of the second areas perpendicular to the first surface is smaller than in the first portion.

13. The super junction semiconductor device according to claim 1, wherein the first and second areas have non-undulated sidewalls.

14. The super junction semiconductor device according to claim 1, wherein the second portion directly adjoins an edge area surrounding the cell area.

15. The super junction semiconductor device according to claim 1, wherein the second portion extends over at least 5% and at most 15% of the cell area.

16. The super junction semiconductor device according to claim 1, wherein at least 50% of the charge carriers generated in the avalanche mode are generated in the second portion.

17. A super junction semiconductor device, comprising:
a super junction structure formed in a semiconductor body with a first surface and a second surface parallel to the first surface, the super junction structure comprising first areas of a first conductivity type and second areas of a second conductivity type opposite the first conductivity type, each second area directly structurally connected with a body zone of the second conductivity type; and
a first electrode structure directly adjoining the first surface and a second electrode structure directly adjoining the second surface, the first electrode structure being electrically connected with source zones that are embedded in the body zones in each of first and second portions of a cell area,
wherein the super junction semiconductor device is configured to accommodate a voltage applied between the first and second electrode structures predominantly in a vertical direction perpendicular to the first surface in the cell area and predominantly in a lateral direction in an edge area surrounding the cell area,
wherein in the edge area the source zones are absent or not connected to the first electrode structure,
wherein along a vertical section of the super junction structure in the cell area a compensation between the first and second areas is nominally stronger de-tuned in the first portion than in the second portion, or nominally stronger de-tuned in the second portion than in the first portion.

* * * * *